United States Patent
Gattere et al.

(10) Patent No.: US 11,993,509 B2
(45) Date of Patent: May 28, 2024

(54) MEMS INCLINOMETER HAVING A REDUCED VIBRATION RECTIFICATION ERROR

(71) Applicant: STMicroelectronics S.r.l., Agrate Brianza (IT)

(72) Inventors: Gabriele Gattere, Castronno (IT); Francesco Rizzini, Passirano (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 425 days.

(21) Appl. No.: 17/179,157

(22) Filed: Feb. 18, 2021

(65) Prior Publication Data

US 2021/0261403 A1 Aug. 26, 2021

(30) Foreign Application Priority Data

Feb. 25, 2020 (IT) ........................ 102020000003868

(51) Int. Cl.
*B81B 3/00* (2006.01)
*G01P 15/00* (2006.01)
*G01P 15/08* (2006.01)

(52) U.S. Cl.
CPC .......... *B81B 3/0018* (2013.01); *G01P 15/001* (2013.01); *B81B 2201/0235* (2013.01); *G01P 2015/0862* (2013.01)

(58) Field of Classification Search
CPC ........... B81B 3/0018; B81B 2201/0235; G01P 15/001; G01P 2015/0862; G01P 2015/0822; G01P 15/125; G01C 9/06; G01C 2009/062; G01C 9/00; G01C 9/02; G01C 25/00
See application file for complete search history.

(56) References Cited

U.S. PATENT DOCUMENTS

| | | | |
|---|---|---|---|
| 2005/0109109 A1 | 5/2005 | Eskridge et al. | |
| 2008/0173092 A1 | 7/2008 | Hattori et al. | |
| 2010/0122579 A1 | 5/2010 | Hsu et al. | |
| 2011/0023604 A1 | 2/2011 | Cazzaniga et al. | |
| 2014/0283605 A1 | 9/2014 | Baldasarre et al. | |
| 2016/0084872 A1* | 3/2016 | Naumann ............... | G01P 15/18 73/514.01 |
| 2016/0305780 A1 | 10/2016 | Comi et al. | |
| 2017/0108336 A1 | 4/2017 | Boysel et al. | |
| 2017/0184400 A1* | 6/2017 | Valzasina ........... | G01C 19/5747 |

FOREIGN PATENT DOCUMENTS

CN 101236214 A 8/2008

\* cited by examiner

*Primary Examiner* — Shahed Ahmed
*Assistant Examiner* — Sun Mi Kim King
(74) *Attorney, Agent, or Firm* — Seed IP Law Group LLP (57) ABSTRACT

A MEMS inclinometer includes a substrate, a first mobile mass and a sensing unit. The sensing unit includes a second mobile mass, a number of elastic elements, which are interposed between the second mobile mass and the substrate and are compliant in a direction parallel to a first axis, and a number of elastic structures, each of which is interposed between the first and second mobile masses and is compliant in a direction parallel to the first axis and to a second axis. The sensing unit further includes a fixed electrode that is fixed with respect to the substrate and a mobile electrode fixed with respect to the second mobile mass, which form a variable capacitor.

20 Claims, 6 Drawing Sheets

MEMS INCLINOMETER HAVING A REDUCED VIBRATION RECTIFICATION ERROR

BACKGROUND

Technical Field

The present disclosure relates to a MEMS (Micro Electro-Mechanical System) inclinometer having a reduced vibration rectification error.

Description of the Related Art

As is known, inclinometers are devices used for monitoring the angle of inclination of an object or of a structure with respect to one or more reference axes or planes. In particular, inclinometers formed by out-of-plane accelerometers (i.e., accelerometers that are sensitive to accelerations along an axis perpendicular to a reference plane, this axis typically coinciding with the direction of the Earth's gravity) are known, which are designed for measuring the inclination of a surface to which they are constrained.

In the industrial field, inclinometers with extremely high precision and resolution are necessary, for example, for monitoring pointing of antennas, the state of structural health of buildings and other architectural structures and the state of levelling of offshore platforms.

Inclinometers built with MEMS technology are obtained on dice of semiconductor material, for example silicon. This has enabled a wide diffusion of these devices thanks to their small dimensions, high accuracy, possibility of integrating them in electrical circuits in order to improve the performance thereof, and low costs.

The mechanism of operation of MEMS inclinometers is typically based upon a capacitive measurement, i.e., upon measurement of the capacitance associated with at least two metal electrodes, arranged facing one another. For instance, inclinometers are known, each comprising two electrodes arranged facing one another so as to form a capacitor with parallel plane faces, as described in the U.S. patent application US2011/0023604A1.

In the above solution, a teeter-totter architecture is described, which includes a mobile mass, a substrate, a plurality of bottom electrodes and a plurality of top electrodes. The bottom electrodes are fixed to the substrate and face corresponding top electrodes, which are fixed with respect to the mobile mass. The mobile mass lies, at rest, in a reference plane parallel to the substrate, and in use is free to rotate about a central pin, which divides the top electrodes into a first set, which includes the top electrodes arranged on a first side with respect to the central pin, and a second set, which includes the top electrodes arranged on a second side with respect to the central pin. In the resting position, the top electrodes of the first and second sets are equidistant from the respective bottom electrodes and therefore the corresponding capacitors have the same capacitance. In use, when the device is subject to an acceleration directed transversally with respect to the reference plane, the mobile mass turns about the central pin. Consequently, it may happen, for example, that the top electrodes of the first set approach the respective bottom electrodes and that the top electrodes of the second set move farther away from the respective bottom electrodes, thus generating a difference of capacitance, which is indicative of the inclination of the device. In greater detail, a difference arises between a first capacitance $C_1$, which depends upon the position of the top electrodes of the first set, and a second capacitance $C_2$, which depends upon the position of the top electrodes of the second set. In particular, the first and second capacitances $C_1$, $C_2$ can be described by the following formulae:

$$C_1 = \frac{\varepsilon_0 A}{g_0 - x}$$

$$C_2 = \frac{\varepsilon_0 A}{g_0 + x}$$

where $\varepsilon_0$ is the vacuum permittivity, A is the area of the electrodes, $g_0$ is the distance at rest between top electrodes and bottom electrodes. Moreover, x represents a displacement, which, in resting conditions, and therefore when the first and second capacitances $C_1$, $C_2$ are equal, is zero. Instead, when the inclinometer is inclined by an angle of inclination $\alpha$, x represents the displacement of the centroid of the top electrodes of the first set in direction of the corresponding bottom electrodes.

To guarantee accuracy in the measurements of capacitance, and therefore of inclination, the MEMS inclinometers should be robust with respect to undesired external stimuli. In particular, the two main sources of disturbance are mechanical stresses, for example due to temperature variations or to deformations of the device, and spurious vibrations of the mobile mass about the pin, which generally have a frequency from a few hertz to a few kilohertz.

For instance, in the presence of spurious vibrations of the mobile mass about the resting position, the displacement x oscillates between a positive value Vp and a negative value Vn, which are the same as one another in absolute value. In addition, the difference between the first and second capacitances $C_1$, $C_2$ is not linear with respect to the displacement x.

Figure 1A:
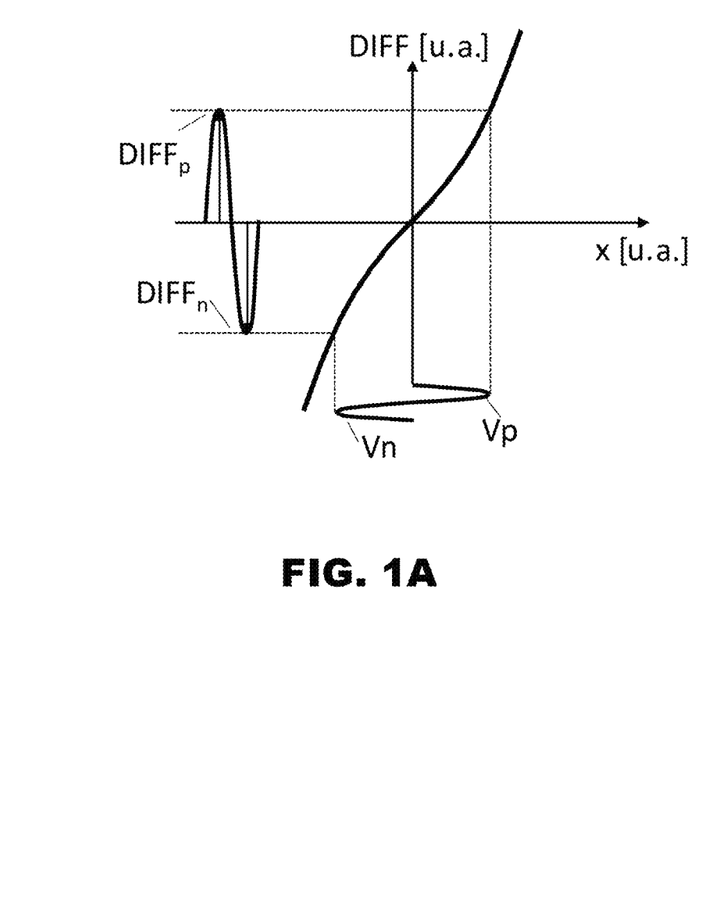
FIGS. 1A and 1B each show the plot of a capacitive quantity indicative of the inclination, as a function of an offset, on the hypothesis of ideal and non-ideal conditions, respectively.

In greater detail, if the first and second capacitances $C_1$, $C_2$ have a same area of the electrodes A and a same distance at rest $g_0$, the curve that defines the variation of the difference between the first and second capacitances $C_1$, $C_2$ (referred to in what follows simply as the difference DIFF) as a function of the displacement x is symmetrical, as shown, for example, in FIG. 1A. Consequently, when the displacement x is equal to the value Vp or Vn, the difference DIFF assumes, respectively, a first and a second value DIFFp and DIFFn, which have a different sign but the same modulus.

Consequently, also in the presence of the aforementioned vibrations, the contribution of said undesired vibrations to the difference DIFF, based on which the inclination is measured, has a zero average. Consequently, the aforementioned undesired contribution can be removed, for example by applying filtering.

Figure 1B:
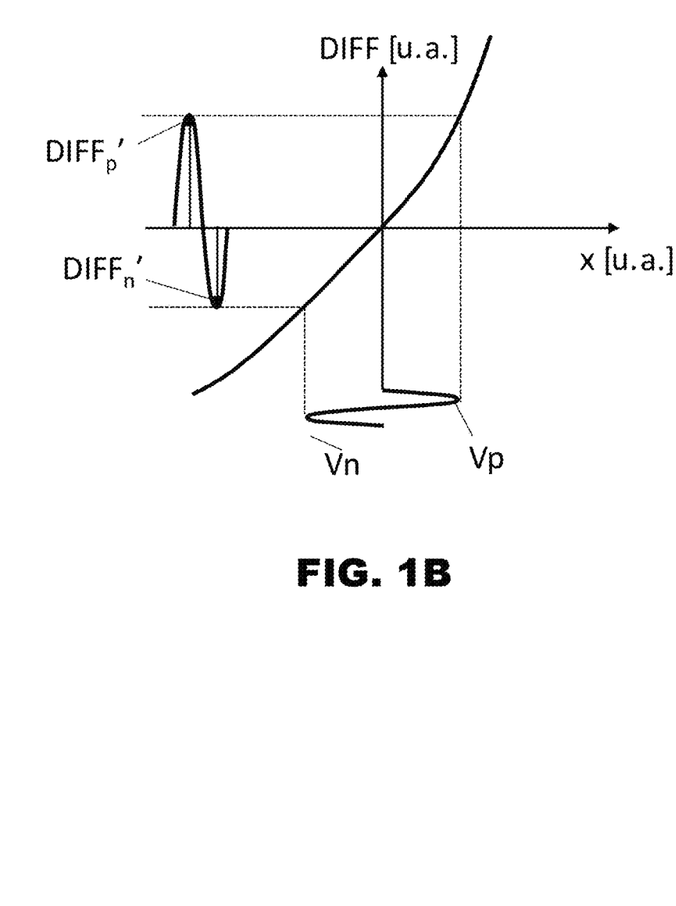

Instead, in the case where the distance at rest between the top electrodes and the corresponding bottom electrodes is not identical for the top electrodes of the first and second sets, and therefore in the case where there is, in resting conditions, an offset gos such that the first and second capacitances $C_1$, $C_2$ can be defined as $$C_1 = \frac{\varepsilon_0 A}{g_0 - g_{os} + x}$$

$$C_2 = \frac{\varepsilon_0 A}{g_0 + g_{os} - x}$$

the difference DIFF has a plot as a function of the non-symmetrical displacement x, as shown in FIG. 1B. Consequently, in the presence of the aforementioned oscillations, when the displacement x is equal to the positive Vp or to the negative value Vn, respectively, the difference DIFF assumes a third and a fourth value DIFFp' and DIFFn', respectively, which have different moduli. Consequently, even when the vibrations about the resting position arise, the contribution of these vibrations to the difference DIFF has a non-zero average; this renders filtering of the aforementioned contribution more problematical. Consequently, the vibrations can cause an error in the measurement of the angle of inclination; this error is known as vibration rectification error (VRE).

In practice, it is known that the tolerances of the current manufacturing processes do not enable elimination of the offset gos. However, various solutions may be implemented to limit the error VRE, albeit only partially. For instance, it is possible to: minimize the offset gos by resorting to more complex and costly manufacturing processes; to reduce the displacement x of the electrodes per acceleration unit, even though this entails a reduction of the sensitivity of the inclinometers, and therefore a greater susceptibility to noise.

BRIEF SUMMARY

In various embodiments, the present disclosure provides a MEMS inclinometer with a reduced error VRE.

In at least one embodiment, a MEMS inclinometer includes a substrate and a first mobile mass suspended over the substrate. In use, the first mobile mass is subject to an acceleration that depends upon an inclination of the inclinometer. A first sensing unit includes a second mobile mass suspended over the substrate. The first sensing unit includes a plurality of elastic elements, each of which is mechanically interposed between the second mobile mass and the substrate and is compliant in a direction parallel to a first axis. The first sensing unit further includes a plurality of elastic structures, each of which is mechanically interposed between the first and second mobile masses and is compliant in a direction parallel to the first axis and to a second axis. The first sensing unit further includes at least one first fixed electrode that is fixed with respect to the substrate, and at least one first mobile electrode that is fixed with respect to the second mobile mass and configured to form a first variable capacitor with the first fixed electrode. Each elastic structure includes at least one respective elongated structure, which, in resting conditions, extends in a direction parallel to a third axis and, in a plane parallel to a plane containing the first axis and the second axis, has main axes of inertia which are transverse with respect to the first and second axes, so that movements of the first mobile mass in a direction parallel to the second axis, caused by said acceleration, cause corresponding movements of the second mobile mass in a direction parallel to the first axis.

In at least one embodiment, a MEMS inclinometer is provided that includes a substrate, a first mobile mass suspended over the substrate and subject, in use, to an acceleration that depends upon an inclination of the inclinometer, and a first sensing unit. The first sensing unit includes: a second mobile mass, suspended over the substrate, the second mobile mass including a first arm extending along a first direction that is parallel to a first axis and a second arm extending along a second direction that is parallel to a second axis, the first axis being perpendicular to the second axis; a first elastic element mechanically coupled between a first side of the second arm of the second mobile mass and the substrate, the first elastic element being compliant along the first direction; a second elastic element mechanically coupled between a second side of the second arm of the second mobile mass and the substrate, the second elastic element being compliant along the first direction, the second side being opposite the first side along the first direction; a third elastic element mechanically coupled between the first side of the second arm of the second mobile mass and the substrate, the third elastic element being compliant along the first direction, the first arm of the second mobile mass disposed between the first elastic element and the third elastic element; a fourth elastic element mechanically coupled between the second side of the second arm of the second mobile mass and the substrate, the fourth elastic element being compliant along the first direction, the first arm of the second mobile mass disposed between the second elastic element and the fourth elastic element; a plurality of elastic structures, each of which is mechanically interposed between the first and second mobile masses and is compliant along the first direction and is rigid along the second direction; at least one first fixed electrode that is fixed with respect to the substrate; and at least one first mobile electrode that is fixed with respect to the second mobile mass and configured to form a first variable capacitor with the first fixed electrode.

BRIEF DESCRIPTION OF THE SEVERAL
VIEWS OF THE DRAWINGS

For a better understanding of the present disclosure, embodiments thereof are now described, purely by way of non-limiting example, with reference to the attached drawings, wherein.

DETAILED DESCRIPTION

A MEMS inclinometer 20 (referred to in what follows more briefly as inclinometer) is described hereinafter, which can be used for measuring an inclination out of the plane, i.e., with respect to an axis Z of a Cartesian reference system XYZ. For instance, the inclinometer 20 may be constrained to an object or a structure in order to measure the inclination of the object/structure.

Figure 2:
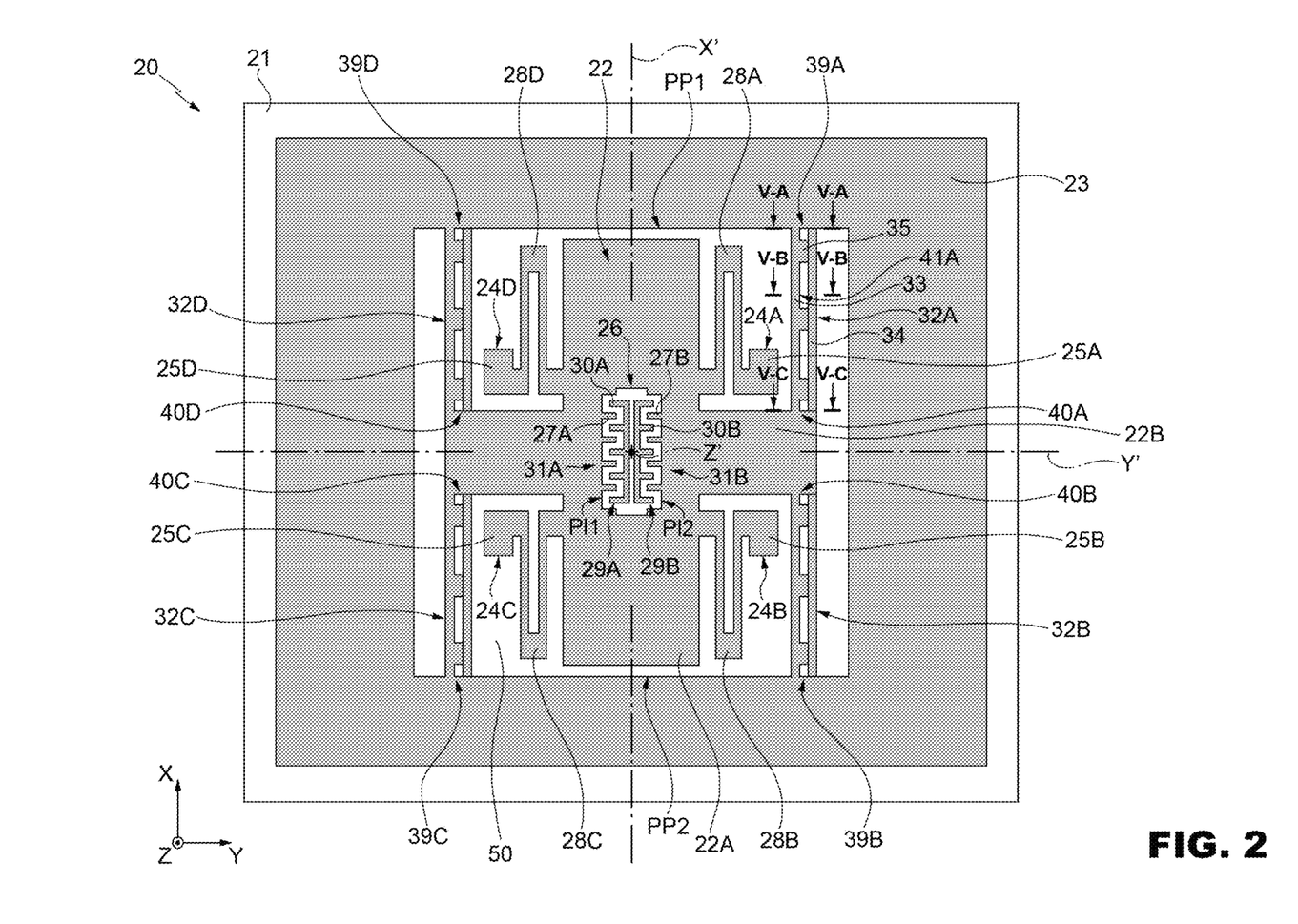
FIG. 2 is a schematic top view of an embodiment of the present inclinometer.

As shown in FIG. 2, the inclinometer 20 comprises a substrate 21 of semiconductor material, for example, silicon, and an inner mass 22 and an outer mass 23, which are made of a conductive material, such as polysilicon.

The inclinometer 20 further comprises four pillars 24A-24D, which extend vertically starting from the substrate 21, with which they form a monolithic body. The four pillars 24A-24D are therefore made, for example, of the same material as the substrate 21.

In greater detail, each pillar 24A-24D extends in a direction parallel to the axis Z and has a bottom end (not illustrated), fixed to the substrate 21, and a top end 25A-25D.

The inner mass 22 is suspended over the substrate 21 and is substantially cross-shaped and is formed by a first and a second arm 22A, 22B, which are mutually orthogonal and have approximately a parallelepiped shape. The first arm 22A has an axis X' parallel to the axis X, whereas the second arm 22B has an axis Y' parallel to the axis Y.

In resting conditions, the inclinometer 20 is symmetrical with respect to a first plane of symmetry Z'Y', parallel to a plane ZY of the Cartesian reference system XYZ.

At the center, the inner mass 22 delimits a secondary cavity 26, which has approximately a parallelepiped shape, and a plurality of first and second projecting portions 27A, 27B, which are also shaped like parallelepipeds, elongated in a direction parallel to an axis Y of the Cartesian reference system XYZ.

In greater detail, the secondary cavity 26 is of a through type, therefore entirely traverses the inner mass 22 and faces the substrate 21. In addition, the secondary cavity 26 is laterally delimited by a first and a second secondary side wall Pl1, Pl2, which are formed by the inner mass 22 and are parallel to the plane Z'X'. The first and second projecting portions 27A, 27B of the inner mass 22 extend, respectively, from the first and from the second secondary side walls Pl1, Pl2 towards the center of the secondary cavity 26.

A first and a second electrode 29A, 29B are arranged within the secondary cavity 26, which are fixed with respect to the underlying substrate 21 and are made of conductive material, such as polysilicon.

In greater detail, each one of the first and second electrodes 29A, 29B is fixed at a respective first end to the substrate 21 and has a comb-shape, which extends in a direction parallel to the axis X and has projections that extend in a direction parallel to the axis Y. In particular, the projections of the first and second electrodes 29A, 29B are designated, respectively, by 30A and 30B. Furthermore, the projections 30A, 30B of the first and second electrodes 29A, 29B are partially set alongside the first and second projecting portions 27A, 27B, respectively, of the inner mass 22. In practice, the first projecting portions 27A of the inner mass 22 and the projections 30A of the first electrode 29A form a first capacitor 31A, the plates of which are interdigitated. The first capacitor 31A has a first capacitance Cp1. Likewise, the second projecting portions 27B of the inner mass 22 and the projections 30B of the second electrode 29B form a second capacitor 31B, the plates of which are interdigitated; the second capacitor 31B has a second capacitance Cp2.

The first arm 22A of the inner mass 22 is elastically coupled to the top ends 25A-25D of the pillars 24A-24D, via four elastic suspension elements 28A-28D, which are made, for example, of the same material as the inner mass 22 (for instance, polysilicon).

In particular, each elastic suspension element 28A-28D is fixed to a corresponding point of the first arm 22A and to the top end 25A-25D of a corresponding pillar 24A-24D. In addition, each elastic suspension element 28A-28D is compliant in a direction parallel to the axis Y and is rigid in a direction parallel to the axes Z and X.

Without this implying any loss of generality, the elastic suspension elements 28A-28D have a spring structure, of a folded type; i.e., they are each formed by a plurality of main arms (two of which are visible in FIG. 2), which, in resting conditions, are elongated in a direction parallel to the axis X and are arranged in succession in a direction parallel to the axis Y, each pair of adjacent main arms having ends connected by a corresponding connection portion, which, in resting conditions, has a shape elongated in a direction parallel to the axis Y.

The outer mass 23 is suspended over the substrate 21 and is substantially frame-shaped (for example, having a rectangular shape in top view) so as to delimit a main cavity 50, inside of which the inner mass 22 extends. In other words, in top view, the outer mass 23 surrounds the inner mass 22.

Albeit not illustrated, the inner mass 22, the outer mass 23 and the elastic suspension elements 28A-28D have a same thickness.

In greater detail, the main cavity 50 is of a through type, therefore entirely traverses the outer mass 23, and has a parallelepiped shape. Moreover, the main cavity 50 is laterally delimited by a first and a second main side wall PP1, PP2, which are formed by the outer mass 23, are opposite to one another and are parallel to the first plane of symmetry Z'Y'.

The mass of the outer mass 23 is greater than the mass of the inner mass 22. Furthermore, the outer mass 23 is elastically coupled to the inner mass 22 through four elastic transformation elements 32A-32D, each of which is compliant in a direction parallel to the axes Z and Y and is rigid in a direction parallel to the axis X.

Each elastic transformation element 32A-32D has a respective first end 39A-39D, which is fixed to the outer mass 23 and a respective second end 40A-40D, which is fixed to the second arm 22B of the inner mass 22.

Figure 3:
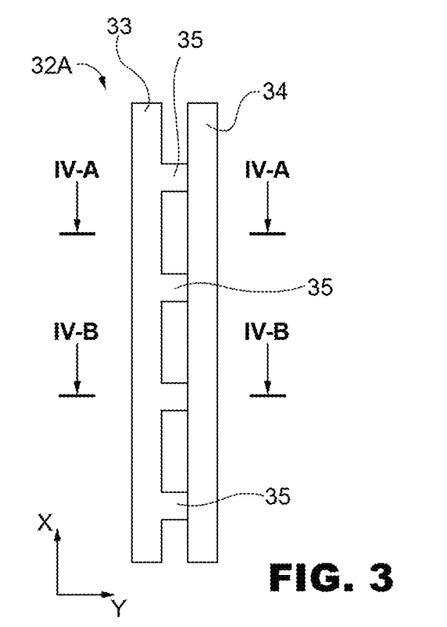
FIG. 3 is a schematic top view of a portion of the inclinometer illustrated in FIG. 2.
Figure 4A:
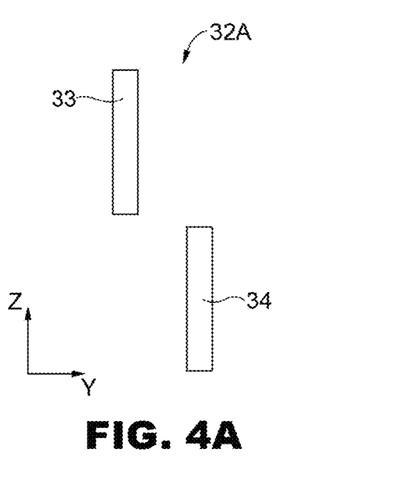
FIGS. 4A and 4B are schematic cross-sectional views of the portion of inclinometer illustrated in FIG. 3.
Figure 4B:
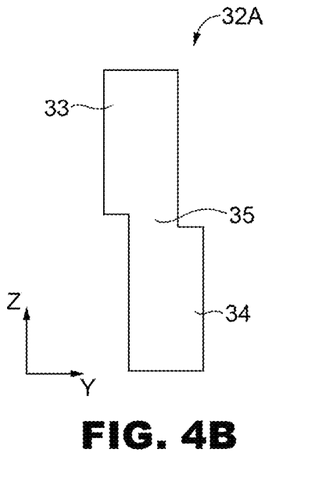

In detail, as shown in FIGS. 3 and 4A-4B, each elastic transformation element 32A-32D has an elongated shape, which in resting conditions extends in a direction parallel to the axis X.

In greater detail, each elastic transformation element 32A-32D comprises a top elongated portion 33, a bottom elongated portion 34 and a plurality of transverse portions 35. Moreover, the top elongated portion 33, the bottom elongated portion 34 and the transverse portions 35 of each elastic transformation element 32A-32D are made, for example, of the same material as that of the inner mass 22 and the outer mass 23 (for example, polysilicon) and form a single piece, and in particular a single elongated structure.

In resting conditions, the top elongated portion 33 and the bottom elongated portion 34 have the shape of parallelepipeds, which have axes parallel to the axis X.

In greater detail, in what follows the elastic transformation elements 32A-32D will be referred to as first, second, third and fourth elastic transformation elements 32A-32D, respectively. Moreover, in resting conditions, the top elongated portion 33 and the bottom elongated portion 34 of each one of the first, second, third and fourth elastic transformation elements 32A-32D are separate from one another, and in particular are laterally staggered both in a direction parallel to the axis Y and in a direction parallel to the axis Z, as may be seen, for example, in FIGS. 4A and 4B. Without this implying any loss of generality, the top elongated portion 33 has a co-ordinate along Y smaller than the co-ordinate along Y of the bottom elongated portion 34. In addition, as illustrated in FIG. 4A, the top elongated portion 33 and the bottom elongated portion 34 are laterally staggered, in a direction parallel to the axis Z, to the point of not overlapping one another even only partially, if observed in a direction parallel to the axis Y.

Furthermore, the first and second elastic transformation elements 32A, 32B are the same as one another and symmetrical with respect to the first plane of symmetry Z'Y'. Moreover, the top elongated portion 33 and the bottom elongated portion 34 of each one of the first and second elastic transformation elements 32A, 32B have a respective first end, which is fixed to a first end of the second arm 22B of the inner mass 22 and a respective second end, which is fixed to a corresponding point of the outer mass 23. Likewise, the third and fourth elastic transformation elements 32C, 32D are the same as one another and symmetrical with respect to the first plane of symmetry Z'Y'. In addition, the top elongated portion 33 and the bottom elongated portion 34 of each one of the third and fourth elastic transformation elements 32C, 32D have a respective first end, which is fixed to a second end of the second arm 22B of the inner mass 22, and a respective second end, which is fixed to a corresponding point of the outer mass 23.

Once again with reference to the embodiment illustrated in FIGS. 2, 3 and 4A-4B, in resting conditions the first elastic transformation element 32A is the same as the fourth elastic transformation element 32D, except for a translation in a direction parallel to the axis Y. Likewise, the second elastic transformation element 32B is the same as the third elastic transformation element 32C, except for the aforementioned translation in a direction parallel to the axis Y. Consequently, the first, second, third and fourth elastic transformation elements 32A-32D are the same as one another.

Furthermore, the first, second, third and fourth elastic transformation elements 32A-32D are directed so that, in top view, the first arm 22A is interposed between the bottom elongated portions 34 of the third and fourth elastic transformation elements 32C, 32D and the top elongated portions 33 of the first and second elastic transformation elements 32A, 32B.

In each one of the first, second, third and fourth elastic transformation elements 32A-32D, the transverse portions 35 have shapes elongated in a direction parallel to the axis Z and are interposed between the bottom elongated portion 34 and the top elongated portion 33, which are arranged on opposite sides of each transverse portion 35. In particular, a top part of each transverse portion 35 laterally contacts the top elongated portion 33, while a bottom part of the transverse portion 35 laterally contacts the bottom elongated portion 34.

In greater detail, as illustrated, without this implying any loss of generality, in FIGS. 3 and 4B, the transverse connection portions 35 are the same as one another and have the shape of parallelepipeds with axes parallel to the axis Z, which are, for example, equispaced in a direction parallel to the axis X.

Figure 5A:
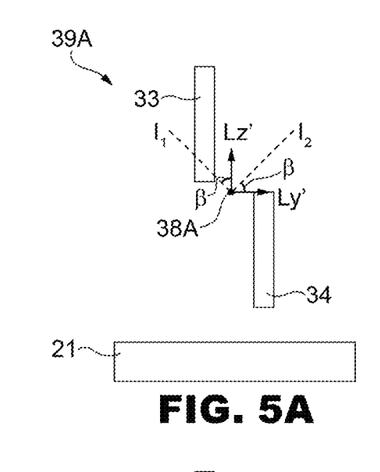
FIGS. 5A-5C show schematically corresponding cross-sections of the portion of inclinometer illustrated in FIG. 3, in resting conditions, as well as corresponding pairs of local axes.
Figure 5B:
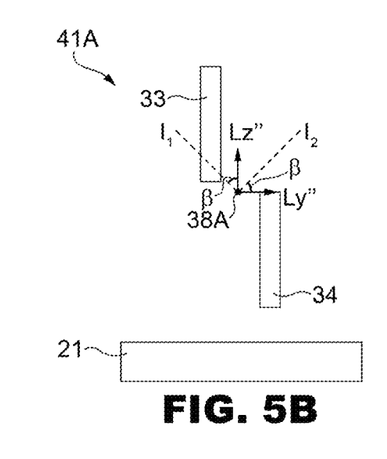
Figure 5C:
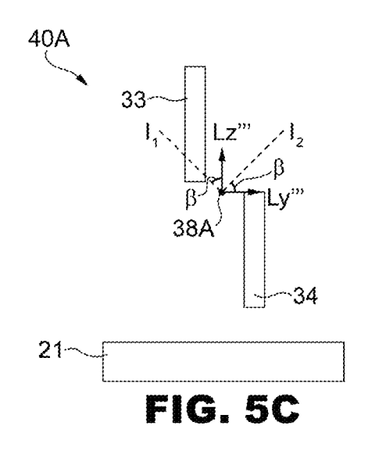

In even greater detail, FIG. 5A shows, by way of example, a cross-section of the first end 39A of the first elastic transformation element 32A. Moreover, FIG. 5B shows a cross-section of a median part 41A of the first elastic transformation element 32A, which is substantially in a position equidistant from the first and from the second ends 39A, 40A. FIG. 5C shows a cross-section of the second end 40A of the first elastic transformation element 32A.

FIGS. 5A-5C highlight how, in resting conditions, the top elongated portion 33 and the bottom elongated portion 34 of the first elastic transformation element 32A are the same as one another and symmetrical with respect to a resting axis 38A parallel to the axis X.

Likewise each of FIGS. 5A-5C illustrate the main axes of inertia $I_1$, $I_2$ of the corresponding section of the first elastic transformation element 32A illustrated, on the hypothesis that said section has an infinitesimal thickness. In particular, in each of FIGS. 5A-5C, the main axes of inertia $I_1$, $I_2$ have a same orientation; moreover, each of the main axes of inertia $I_1$, $I_2$ is transverse with respect both to the axis Y and to the axis Z. Again with reference to FIGS. 5A-5C, shown therein, in resting conditions, are also pairs of local axes (designated, respectively, by Ly'-Lz', Ly"-Lz" and Ly'"-Lz'"), each pair being formed by axes parallel, respectively, to the axis Y and to the axis Z and passing through the centroid of the section illustrated.

For each section of the first elastic transformation element 32A, it is possible to calculate a centrifugal moment of inertia $I_C$, with respect to the corresponding pair of local axes, by solving the integral:

$$I_C = \iint r_1 r_2 \, dA,$$

where $r_1$ and $r_2$ represent the distance of each point of the section from a first axis and a second axis, respectively, of the pair of local axes, while $dA$ is the unit of area of the section. Said centrifugal moment of inertia $I_C$ is not null, since the local axes are not axes of symmetry of the section and therefore do not coincide with the main axes of inertia $I_1$, $I_2$. In particular, the main axes of inertia $I_1$, $I_2$ form an angle β with the local axis parallel to the axis Z and the local axis parallel to the axis Y, respectively.

Consequently, with reference, for example, to the section illustrated in FIG. 5B, a force applied on the first elastic transformation element 32A, for instance along the local axis Lz", generates a so-called deviated flexure of the first elastic transformation element 32A. In particular, this force causes a deformation along the local axis Lz", which leads to a consequent deformation along the local axis Ly".

The foregoing considerations regarding the arrangement of the main axes of inertia also apply in the case of the sections of each one of the first, second, third and fourth elastic transformation elements 32A-32D that traverse corresponding transverse portions 35 (as shown, for example, in FIG. 4B).

Figure 6A:
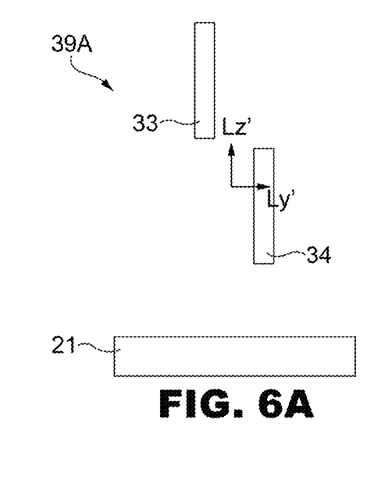
FIGS. 6A-6C show, respectively, the cross-sections illustrated in FIGS. 5A-5C, in conditions different from the resting conditions, as well as the pairs of local axes illustrated in FIGS. 5A-5C, in the same positions.

In use, the inclinometer 20 undergoes a direct acceleration in a direction parallel to the axis Z, for example due to the acceleration of gravity or vibrations. Furthermore, acting on the outer mass 23 is an external force having a direction opposite to the aforementioned acceleration, said external force having a component parallel to the axis Z, referred to in what follows as the external force Fi. The inner mass 22 is fixed with respect to the substrate 21 for displacements parallel to the axis Z, since the elastic suspension elements 28A-28D via which it is coupled to the substrate 21 are rigid along the axis Z. The external force Fi therefore causes a displacement, with respect to the substrate 21, of the outer mass 23 and of the first end 39A of the first elastic transformation element 32A, in the direction of the external force Fi, as shown in FIG. 6A (where the external force Fi is assumed to have a direction concordant with that of the axis Z) since the elastic transformation elements 32A-32D, via which the outer mass 23 is coupled to the inner mass 22, are compliant along the axis Z. For instance, the first end 39A of the first elastic transformation element 32A moves farther away from the substrate 21 with respect to the resting position, and more precisely translates in a direction parallel to the axis Z.

To a first approximation, the first end 39A does not undergo a deformation of the type described with reference to FIG. 5B since it is fixed with respect to the outer mass 23.

Figure 6B:
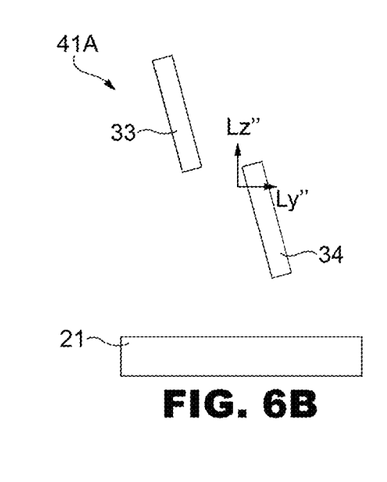
Figure 6C:
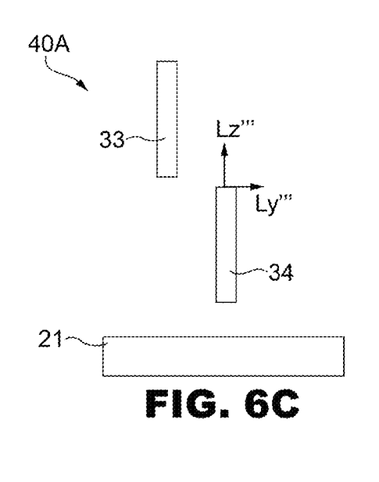

Instead, acting on the median part 41A of the first elastic transformation element 32A is a local force Fi*, which depends upon the external force Fi and is parallel to the latter; consequently, the median part 41A of the first elastic transformation element 32A is subjected to deviated flexure, as illustrated in FIG. 6B. In particular, the median part 41A of the first elastic transformation element 32A undergoes, with respect to the substrate 21, i) a translation in a direction parallel to the axis Z (of lesser degree than the one undergone by the first end 39A), ii) a translation in a direction parallel to the axis Y, and iii) a rotation in a plane parallel to the plane ZY. In addition, as illustrated in FIG. 6C, to a first approximation, the second end 40A of the first elastic transformation element 32A does not undergo any translation in a direction parallel to the axis Z since it is fixed with respect to the inner mass 22, which is in turn fixed with respect to the substrate 21, but only undergoes a translation in a direction parallel to the axis Y, of a degree greater than the translation parallel to the axis Y undergone by the median part 41A of the first elastic transformation element 32A.

In general, the considerations regarding the movements of the median part 41A of the first elastic transformation element 32A can be applied to any part of the first elastic transformation element 32A other than the first and second ends 39A, 40A, albeit with the differences that derive from the different positioning along the axis X. Moreover, the considerations regarding the first elastic transformation element 32A can be applied also to the second, third and fourth elastic transformation elements 32B-32D.

The translations in a direction parallel to the axis Y of the second end 40A-40D of the first, second, third and fourth elastic transformation elements 32A-32D also cause a translation in a direction parallel to the axis Y of the inner mass 22 since, as mentioned previously, the elastic suspension elements 28A-28D are compliant in a direction parallel to the axis Y. Consequently, the relative position between the first projecting portions 27A of the inner mass 22 and the projections 30A of the first electrode 29A changes; at the same time, also the relative position between the second projecting portions 27B of the inner mass 22 and the projections 30B of the second electrode 29B changes. There follow variations of opposite sign of the values of the first and second capacitances Cp1, Cp2 of the first and second capacitors 31A, 31B, which can be detected in a per se known manner and therefore indicative of the inclination undergone by the inclinometer 20.

In practice, an acceleration out of the plane (along the axis Z) causes, in a plane parallel to the plane XY, a displacement of an electrode of each one of the first and second capacitors 31A, 31B, which, as mentioned, have an interdigitated structure, which in turn guarantees a linear dependence of the respective capacitance upon the distance between the electrodes, thus eliminating the problem of the vibration rectification error. In particular, the first and second capacitances Cp1 and Cp2 are directly proportional to $(L_{ov}-x_{os}-x)$ and $(L_{ov}+x_{os}+x)$, respectively, where $(L_{ov}-x_{os})$ and $(L_{ov}+x_{os})$, respectively, represent the degree of overlapping along X i) of the first projections 27A of the inner mass 22 and of the projections 30A of the first electrode 29A, and ii) of the second projections 27B of the inner mass 22 and of the projections 30B of the second electrode 29B; x represents the displacement along Y of the inner mass 22 with respect to the resting position.

Figure 7:
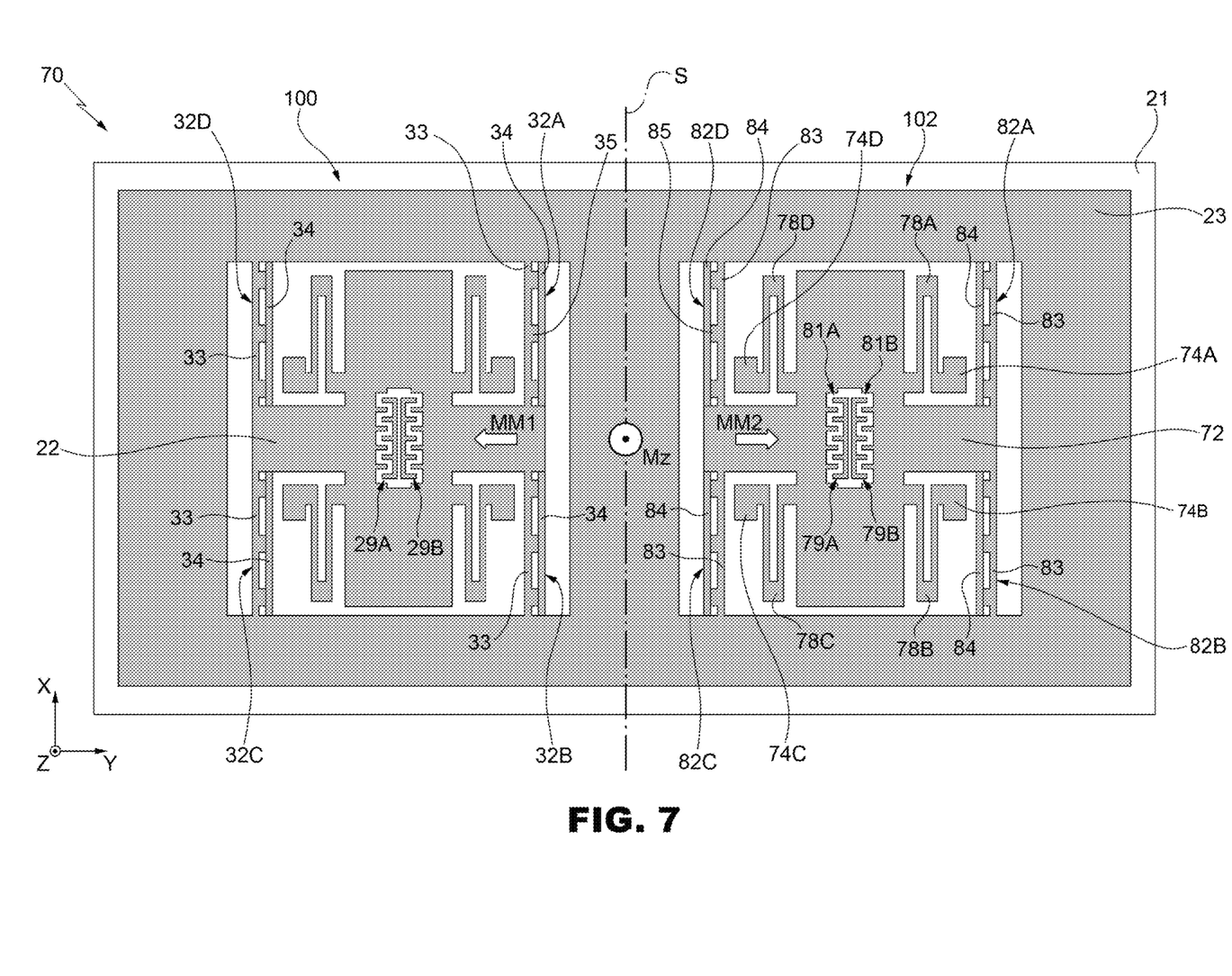
FIGS. 7 and 8 are schematic top views of further embodiments of the present inclinometer.

FIG. 7 shows an inclinometer 70 according to another embodiment, which is now described with reference only to the differences with respect to the inclinometer 20, except where otherwise specified.

In detail, the inclinometer 70 comprises a first part 100, which is the same as the inclinometer 20. In addition, the inclinometer 70 comprises a second part 102; the first and second parts 100, 102 are symmetrical with respect to a second plane of symmetry S, parallel to the plane ZX, and moreover share the substrate 21 and the outer mass 23. Furthermore, except where specified otherwise, the elements of the second part 102 are designated by the same reference numbers as those of the corresponding elements of the inclinometer 20, increased by 50. In practice, both the first and the second parts 100, 102 function in the same way as the inclinometer 20, except for the differences described hereinafter.

In detail, the ensemble formed by the inner mass 22, the pillars 24A-24D, the elastic suspension elements 28A-28D, the first and second projections 27A, 27B of the inner mass 22, the first, second, third and fourth elastic transformation elements 32A-32D and the first and second electrodes 29A, 29B forms a first sensing unit, which is the same as a second sensing unit, which is formed by the ensemble constituted by the inner mass 72, the pillars 74A-74D, the elastic suspension elements 78A-78D, the first and second projections 77A, 77B of the inner mass 72, the first, second, third and fourth elastic transformation elements 82A-82D and the first and second electrodes 79A, 79B, except for a translation along the axis Y and for the aspect described in what follows.

In detail, in each one of the first, second, third and fourth elastic transformation elements 82A-82D of the second part 102, the arrangement of the respective top elongated portion 83 and of the respective bottom elongated portion 84 is reversed with respect to what occurs in the corresponding elastic transformation element 32A-32D of the first part 100. In other words, with reference, for example, to the first elastic transformation element 82A of the second part 102 (but the same considerations apply to the second, third and fourth elastic transformation elements 82B-82D), the bottom elongated portion 84 has a co-ordinate along Y smaller than the co-ordinate along Y of the top elongated portion 83. In this way, with reference, for example, to the fourth elastic transformation element 82D of the second part 102, this has a symmetrical shape, relative to the second plane of symmetry S, with respect to the first elastic transformation element 32A of the second part 100.

In use, in the presence of an acceleration directed out of the plane, the movement (for example, designated by MZ in FIG. 7) of the outer mass 23 in a direction parallel to the axis Z causes, in addition to a translation of the inner mass 22 of the first part 100 parallel to the axis Y in a first direction, also a translation of the inner mass 72 of the second part 102, once again parallel to the axis Y, but in a second direction opposite to the first direction. In FIG. 7, examples of the possible translations of the inner masses 22, 72 of the first and second parts 100, 102 are designated by MM1 and MM2. To a first approximation, the translations MM1, MM2 of the inner masses 22, 72 of the first and second parts 100, 102 have a same degree. In other words, the inner masses 22, 72 of the first and second parts 100, 102 move in phase opposition. In this connection, it is possible to demonstrate that the main axes of inertia $I_1$, $I_2$ of the sections of the elastic transformation elements 82A-82D are rotated in a clockwise direction by an angle equal to twice the aforementioned angle β, with respect to the arrangement of the corresponding main axes of inertia of the elastic transformation elements 32A-32D.

In practice, by electrically connecting in an appropriate way the first and second electrodes 29A, 29B of the first part 100 and the first and second electrodes 79A, 79B of the second part 102, it is possible to improve the estimation of the inclination, and therefore of the acceleration along Z, or carry out a measurement of acceleration in a direction parallel to the axis Y.

In particular, recalling that the first and second capacitors 31A, 31B of the first part 100 have a first and a second capacitance Cp1, Cp2, respectively, and denoting by Cp3 and Cp4, respectively, the capacitances of the first and second capacitors 81A, 81B of the second part 102, in order to render the measurement of the acceleration along Z independent of possible accelerations along Y, it is possible to determine the estimation of the acceleration along Z on the basis of the following quantity: DELTA_Z=(Cp2+Cp3)−(Cp1+Cp4). In fact, the contributions to the quantity DELTA_Z due to the variations of the values of capacitance Cp1-Cp4 caused by possible accelerations undergone by the inclinometer 70 along Y cancel out.

Moreover, it is possible to obtain a measurement of the acceleration to which the inclinometer 70 is subjected in a direction parallel to the axis Y, based on the following quantity DELTA_Y=(Cp1+Cp3)−(Cp2+Cp4). In fact, the contributions to the quantity DELTA_Y due to the variations of the values of capacitance Cp1-Cp4 caused by possible accelerations to which the inclinometer 70 is subjected in a direction parallel to the axis Z cancel out.

Figure 8:
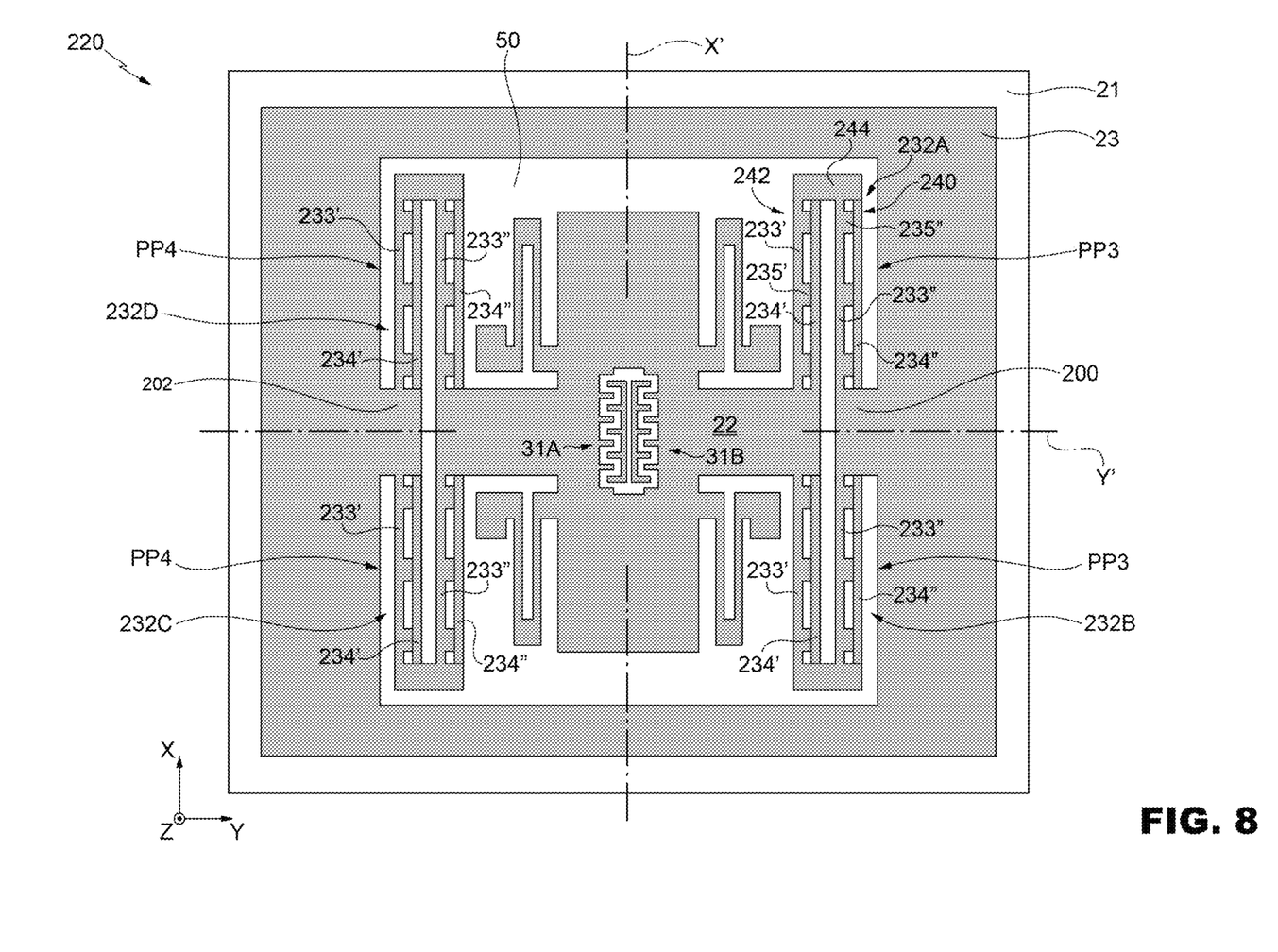

As shown in FIG. 8, variants are moreover possible, in which the elastic transformation elements have a shape different from the one described. In particular, FIG. 8 shows an inclinometer 220, which is described limitedly to the differences with respect to what is illustrated in FIG. 2.

In detail, the inclinometer 220 comprises a first and a second anchorage portion 200, 202, which are made of the same material as the outer mass 23, with respect to which they are fixed and with which they form a single piece. In addition, the first and second anchorage portions 200, 202 have the shape of parallelepipeds that extend towards the center of the main cavity 50, starting, respectively, from a third and a fourth main side wall PP3, PP4 of the main cavity 50, which are formed by the outer mass 23, are opposite to one another and are parallel to the plane Z'X'. The first and second anchorage portions 200, 202 are the same as one another and symmetrical with respect to the plane Z'X'. Furthermore, the first and second anchorage portions 200, 202 have the same thickness as the outer mass 23.

In addition, with reference, for example, to the first elastic transformation element, here designated by 232A (but the same considerations also apply to the second, third and fourth elastic transformation elements 232B-232D), this has a folded shape.

In detail, the first elastic transformation element 232A comprises a first and a second elongated structure 240, 242, and a connection arm 244, which are made of the same material as the inner mass 22 (for example, polysilicon).

Each one of the first and second elongated structures 240, 242 comprises a respective top elongated portion (designated by 233' and 233" in the case of the first and second elongated structures 240, 242, respectively) and a respective bottom elongated portion (designated by 234' and 234" in the case of the first and second elongated structures 240, 242, respectively), which, in resting conditions, have the shape of parallelepipeds with axes parallel to the axis X. In addition, each of the first and second elongated structures 240, 242 comprises a respective plurality of transverse portions (designated by 235' and 235" in the case of the first and second elongated structures 240, 242, respectively), which, without this implying any loss of generality, are the same as one another and have the shape of parallelepipeds with axes parallel to the axis Z, which are, for example, equispaced in a direction parallel to the axis X. Moreover, with reference for brevity to just the first elongated structure 240 (but the same considerations apply to the second elongated structure 242), the mutual arrangement of the top elongated portion 233', the bottom elongated portion 234', and the transverse portions 235 is, for example, the same as what has been described as regards the first elastic transformation element 32A illustrated in FIG. 2. In practice, the first and second elongated structures 240, 242 are the same as one another, but for a translation in a direction parallel to the axis Y.

The connection portion 244 has the shape of a parallelepiped, with walls parallel alternately to the plane ZY or to the plane ZX and has a thickness equal to the thickness of the outer mass 23.

In even greater detail, each one of the top elongated portion 233' and the bottom elongated portion 234' of the first elongated structure 240 is fixed, at a respective first end, to a corresponding point of the second arm 22B of the inner mass 22, as well as, at a respective second end, to a corresponding point of the connection portion 244. Furthermore, each one of the top elongated portion 233" and the bottom elongated portion 234" of the second elongated structure 242 is fixed, at a respective first end, to a corresponding point of the first anchorage portion 200, as well as, at a respective second end, to a corresponding point of the connection portion 244.

As explained previously with reference to FIG. 2, the first and second elastic transformation elements 232A, 232B are symmetrical with respect to the first plane of symmetry Z'Y'. Likewise, the third and fourth elastic transformation elements 232C, 232D are symmetrical with respect to the first plane of symmetry Z'Y'. In addition, the first and fourth elastic transformation elements 232A, 232D are the same, except for a translation in a direction parallel to the axis Y. The second and third elastic transformation elements 232B, 232C are the same, except for the aforementioned translation in a direction parallel to the axis Y. Consequently, the first, second, third and fourth elastic transformation elements 232A-232D are the same as one another.

In use, the first, second, third and fourth elastic transformation elements 232A-232D behave in the same way as the first, second, third and fourth elastic transformation elements 32A-32D illustrated in FIG. 2, but are characterized by the possibility of having a greater length (understood as sum of the lengths of the respective first and second elongated structures 240, 242), given the same dimensions of the main cavity 50, and therefore of the inclinometer. Moreover, this greater length leads to a greater elasticity, and therefore guarantees a greater sensitivity of the inclinometer.

The advantages that the present inclinometer affords emerge clearly from the foregoing description. In particular, the present inclinometer enables conversion of an out-of-plane acceleration into an in-plane movement, so as to favor, for the purposes of measurement of an acceleration, linearity of the variation of capacitance of a variable capacitor with interdigitated electrodes when the latter are moved in a direction parallel to the direction of elongation of the respective projections, which are interdigitated with respect to one another. In this way, the error VRE is reduced.

Furthermore, at least some of the embodiments described are suited not only to the measurement of out-of-plane accelerations, but also to use as in-plane accelerometers.

Finally, it is clear that modifications and variations may be made to the inclinometer described and illustrated herein, without thereby departing from the scope of the present disclosure.

For instance, the shape of the elastic transformation elements may be different from what has been described. For instance, the shape of the transverse portions may be different from what has been described. In this regard, the number and spacing of the transverse portions, as also possibly the number of foldings in the case of elastic transformation elements of a folded type, may be chosen as a function of the desired elasticity for the elastic transformation elements. In any case, the presence of at least one transverse portion enables mechanical coupling of the corresponding bottom and top elongated portions, and therefore prevents the latter from undergoing deformation in an independent way, thereby reducing the effectiveness of the conversion of the out-of-plane acceleration into the in-plane movement.

It is moreover possible, considering any elastic transformation element, for the orientation of the main axes of inertia to vary as a function of the position along X of the plane (parallel to Z'Y') of the section considered. However, should it happen that, in one or more sections, the orientations of the corresponding main axes of inertia coincide with the axes Z and Y, there would be a reduction in the effectiveness of the conversion of the out-of-plane acceleration into the in-plane movement.

Finally, the various embodiments described may be combined so as to provide further solutions.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A Micro Electro-Mechanical System (MEMS) inclinometer, comprising:
   a substrate;
   a first mobile mass suspended over the substrate and subject, in use, to an acceleration that depends upon an inclination of the inclinometer; and
   a first sensing unit including:
      a second mobile mass, suspended over the substrate;
      a plurality of elastic elements, each of which is mechanically interposed between the second mobile mass and the substrate and is compliant in a direction parallel to a first axis;
      a plurality of elastic structures coupling the first and second mobile masses compliant in the direction parallel to the first axis and to a second axis;
      at least one first fixed electrode that is fixed with respect to the substrate; and
      at least one first mobile electrode that is fixed with respect to the second mobile mass and configured to form a first variable capacitor with said first fixed electrode,
      wherein each elastic structure includes at least one respective elongated structure, which, in resting conditions, extends in a direction parallel to a third axis and, in a plane parallel to a plane containing the first axis and the second axis, has main axes of inertia which are transverse with respect to the first and second axes, so that movements of the first mobile mass in a direction parallel to the second axis, caused by said acceleration, cause corresponding movements of the second mobile mass in a direction parallel to the first axis.

2. The MEMS inclinometer according to claim 1, wherein the first fixed electrode and the first mobile electrode have respective projections, which are elongated in a direction parallel to the first axis and are interdigitated.

3. The MEMS inclinometer according to claim 1, wherein said third axis is transverse to said plane parallel to a plane containing the first axis and the second axis.

4. The MEMS inclinometer according to claim 1, wherein each elongated structure includes a top elongated portion, a bottom elongated portion, and a plurality of transverse portions, the top elongated portion and the bottom elongated portion extending, in resting conditions, in a direction parallel to the third axis and being spaced along the first axis and along the second axis, each transverse portion being interposed between the top elongated portion and the bottom elongated portion,
   wherein the transverse portions, the top elongated portion and the bottom elongated portion form a single piece.

5. The MEMS inclinometer according to claim 4, wherein the transverse portions have a shape elongated in a direction parallel to the second axis and are arranged in succession in a direction parallel to the third axis.

6. The MEMS inclinometer according to claim 4, wherein the top elongated portion and the bottom elongated portion of each elongated structure each have a respective first end and a respective second end, which are respectively fixed to the first and second mobile masses.

7. The MEMS inclinometer according to claim 1, wherein each elongated structure is fixed between the first and second mobile masses and, in each plane parallel to said plane containing the first and second axes, has main axes of inertia arranged transversally with respect to the first and second axes.

8. The MEMS inclinometer according to claim 1, wherein each elastic structure includes a respective plurality of elongated structures, which are connected so as to form a folded structure, which has a first end and a second end fixed to the first and second mobile masses, respectively.

9. The MEMS inclinometer according to claim 8, wherein, in each plane parallel to said plane containing the first and second axes, each elongated structure has main axes of inertia arranged transversally with respect to the first and second axes.

10. The MEMS inclinometer according to claim 1, wherein the elastic structures are the same except for translations parallel to the first axis or to the third axis.

11. The MEMS inclinometer according to claim 1, wherein the second mobile mass is cross-shaped and includes a first arm and a second arm,
   each elastic structure is fixed to a respective end of the second arm of the second mobile mass and to the first mobile mass, and
   each elastic element has a first end and a second end, which are respectively fixed to the first arm of the second mobile mass and to the substrate.

12. The MEMS inclinometer according to claim 1, wherein the second mobile mass laterally delimits a cavity that faces the substrate, and the first fixed electrode extends from the substrate until it penetrates into the cavity.

13. The MEMS inclinometer according to claim 1, comprising a second sensing unit, the second sensing unit including:
a third mobile mass, suspended over the substrate;
a plurality of respective elastic elements, each of which is mechanically interposed between the third mobile mass and the substrate and is compliant in a direction parallel to the first axis;
a plurality of respective elastic structures, each of which is mechanically interposed between the first and third mobile masses and is compliant in a direction parallel to the first axis and to the second axis;
at least one respective first fixed electrode fixed with respect to the substrate; and
at least one respective first mobile electrode fixed with respect to the third mobile mass and configured to form a respective first variable capacitor with the first fixed electrode of the second sensing unit,
wherein the elastic structures of the second sensing unit are configured so that said movements of the first mobile mass in a direction parallel to the second axis, caused by said acceleration, cause corresponding movements of the third mobile mass in a direction parallel to the first axis, which have a direction opposite to said movements of the second mobile mass in a direction parallel to the first axis.

14. The MEMS inclinometer according to claim 13, wherein the first sensing unit further comprises:
a respective second fixed electrode fixed with respect to the substrate; and
a respective second mobile electrode fixed with respect to the second mobile mass and configured to form a corresponding second variable capacitor with the second fixed electrode of the first sensing unit,
wherein the second sensing unit further includes:
a respective second fixed electrode fixed with respect to the substrate; and
a respective second mobile electrode fixed with respect to the third mobile mass and configured to form a corresponding second variable capacitor with the second fixed electrode of the second sensing unit.

15. A Micro Electro-Mechanical System (MEMS) inclinometer, comprising:
a substrate;
a first mobile mass suspended over the substrate and subject, in use, to an acceleration that depends upon an inclination of the inclinometer; and
a first sensing unit including:
a cross-shaped second mobile mass 7 suspended over the substrate, including:
a central cavity;
a first arm extending along a first direction that is parallel to a first axis; and
a second arm extending along a second direction that is parallel to a second axis, the first axis being perpendicular to the second axis;
a first elastic element mechanically coupled between a first side of the second arm of the second mobile mass and the substrate, the first elastic element being compliant along the first direction;
a second elastic element mechanically coupled between a second side of the second arm of the second mobile mass and the substrate, the second elastic element being compliant along the first direction, the second side being opposite the first side along the first direction;
a third elastic element mechanically coupled between the first side of the second arm of the second mobile mass and the substrate, the third elastic element being compliant along the first direction, the first arm of the second mobile mass disposed between the first elastic element and the third elastic element;
a fourth elastic element mechanically coupled between the second side of the second arm of the second mobile mass and the substrate, the fourth elastic element being compliant along the first direction, the first arm of the second mobile mass disposed between the second elastic element and the fourth elastic element;
a plurality of elastic structures coupling the first and second mobile masses compliant along the first direction and rigid along the second direction, the plurality of elastic structures extending from the second arm in the first direction to the first mobile mass;
at least one first fixed electrode that is fixed with respect to the substrate, the at least one fixed electrode being in the central cavity of the second mobile mass; and
at least one first mobile electrode that is fixed with respect to the second mobile mass and configured to form a first variable capacitor with the first fixed electrode.

16. The MEMS inclinometer according to claim 15, wherein each elastic structure includes at least one respective elongated structure, which, in a resting condition, extends in along the second direction and, in a plane parallel to a plane containing the first axis and a third axis that is perpendicular to the first axis and the second axis, has main axes of inertia which are transverse with respect to the first and third axes, so that movements of the first mobile mass in a direction parallel to the third axis, caused by said acceleration, cause corresponding movements of the second mobile mass in the first direction.

17. The MEMS inclinometer according to claim 15, wherein the plurality of elastic structures includes:
a first elastic structure coupled between the first mobile mass and a first side of the first arm of the second mobile mass;
a second elastic structure coupled between the first mobile mass and the first side of the first arm of the second mobile mass, the second arm of the second mobile mass disposed between the first and second elastic structures;
a third elastic structure coupled between the first mobile mass and a second side of the first arm of the second mobile mass that is opposite the first side of the first arm of the second mobile mass; and
a fourth elastic structure coupled between the first mobile mass and the second side of the first arm of the second mobile mass, the second arm of the second mobile mass disposed between the third and fourth elastic structures.

18. The MEMS inclinometer according to claim 15, wherein the first fixed electrode and the first mobile electrode have respective projections which are elongated along the first direction and are interdigitated.

19. The MEMS inclinometer according to claim 15, wherein the first mobile mass forms a frame that laterally surrounds the second mobile mass.

20. The MEMS inclinometer according to claim 15, wherein the second mobile mass laterally delimits the central cavity that faces the substrate, and the at least one first fixed electrode extends from the substrate and extends at least partially into the cavity.

* * * * *

UNITED STATES PATENT AND TRADEMARK OFFICE
CERTIFICATE OF CORRECTION

PATENT NO. : 11,993,509 B2
APPLICATION NO. : 17/179157
DATED : May 28, 2024
INVENTOR(S) : Gabriele Gattere et al.

It is certified that error appears in the above-identified patent and that said Letters Patent is hereby corrected as shown below:

In the Claims

Column 15, Claim 15, Line 53:
"mobile mass 7 suspended"
Should read:
--mobile mass suspended--.

Signed and Sealed this
Thirtieth Day of July, 2024

Katherine Kelly Vidal
*Director of the United States Patent and Trademark Office*